US 6,741,497 B2

(12) United States Patent
Roohparvar et al.

(10) Patent No.: US 6,741,497 B2
(45) Date of Patent: May 25, 2004

(54) FLASH MEMORY WITH RDRAM INTERFACE

(75) Inventors: Frankie Fariborz Roohparvar, Milpitas, CA (US); Kevin C. Widmer, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,399

(22) Filed: Aug. 30, 2001

(65) Prior Publication Data
US 2003/0043625 A1 Mar. 6, 2003

(51) Int. Cl.[7] .......................... G11C 14/00; G11C 16/04; G11C 7/00; G11C 7/02; G11C 8/00
(52) U.S. Cl. .............................. 365/185.08; 365/185.11; 365/185.17; 365/189.02; 365/189.05; 365/207; 365/230.02; 365/230.03; 365/230.08; 365/233
(58) Field of Search .................. 365/185.08, 185.11, 365/185.17, 189.02, 189.05, 207, 230.02, 230.03, 230.08, 233

(56) References Cited

U.S. PATENT DOCUMENTS

| | | | |
|---|---|---|---|
| 5,511,024 A | | 4/1996 | Ware et al. |
| 5,986,948 A | * | 11/1999 | Cloud ........................ 365/193 |
| 6,151,268 A | * | 11/2000 | Yoshikawa ............. 365/230.09 |
| 6,215,686 B1 | * | 4/2001 | Deneroff et al. ............... 365/52 |
| 6,226,755 B1 | * | 5/2001 | Reeves ........................ 713/400 |
| 6,310,814 B1 | | 10/2001 | Hampel et al. |
| 6,324,602 B1 | * | 11/2001 | Chen et al. .................... 710/68 |
| 6,411,152 B1 | * | 6/2002 | Dobberpuhl ................ 327/291 |
| 6,426,916 B2 | * | 7/2002 | Farmwald et al. ........... 365/233 |
| 6,480,946 B1 | * | 11/2002 | Tomishima et al. ......... 711/167 |
| 6,487,648 B1 | * | 11/2002 | Hassoun ...................... 711/167 |
| 6,510,503 B2 | * | 1/2003 | Gillingham et al. ......... 711/167 |
| 6,522,188 B1 | * | 2/2003 | Poole ......................... 327/407 |
| 2001/0044891 A1 | * | 11/2001 | McGrath et al. ............. 712/229 |
| 2001/0047450 A1 | * | 11/2001 | Gillingham et al. ......... 711/105 |
| 2002/0041633 A1 | * | 4/2002 | Cho et al. .................... 375/259 |
| 2002/0083359 A1 | * | 6/2002 | Dow .......................... 713/500 |
| 2002/0147889 A1 | * | 10/2002 | Kruckemyer et al. ....... 711/144 |
| 2002/0174252 A1 | * | 11/2002 | Hayter et al. ................ 709/250 |

OTHER PUBLICATIONS

Rambus "Direct RDRAM 128/144–Mbit (256Kx16/18x32s)" Document DL0059, Version 1.11 *Preliminary Information* pp. 1–20 (date not available).

* cited by examiner

Primary Examiner—David Nelms
Assistant Examiner—Ly Duy Pham
(74) Attorney, Agent, or Firm—Leffert Jay & Polgalze, P.A.

(57) ABSTRACT

A flash memory has been described that has an interface corresponding to a rambus dynamic random access memory (RDRAM). The memory samples commands and addresses on a rising edge of a clock signal. The read and write data are provided on both the rising edge and the falling edge of the clock signal.

5 Claims, 2 Drawing Sheets

Fig. 2 (TOP VIEW)

| | A | B | C | D | E | F | G | H | J | K | L | M | N | P | R | S |
|---|---|---|---|---|---|---|---|---|---|---|---|---|---|---|---|---|
| 10 | VDD | GND | | VDD | GND | VDD | | | | | VDD | VDD | VDD | | GND | VDD |
| 9 | | | | | | | | | | | | | | | | |
| 8 | VDD | CMD | VDD | GND | GNDa | GNDa | VDD | | | | VDD | VDD | VDD | | Vcmos | VDD |
| 7 | DQA8 | DQA7 | DQA5 | DQA3 | DQA1 | CTMN | CTM | RQ7 | RQ5 | RQ3 | RQ1 | DQB1 | DQB3 | DQB5 | DQB7 | DQB8 |
| 6 | | | | | | | | | | | | | | | | |
| 5 | | | | | | | | | | | | | | | | |
| 4 | GND | DQA6 | DQA4 | DQA2 | DQA0 | CFM | CFMN | RQ6 | RQ4 | RQ2 | RQ0 | DQB0 | DQB2 | DQB4 | DQB6 | GND |
| 3 | GND | SCK | Vcmos | GND | VDD | GND | VDDa | VREF | GND | VDD | GND | GND | VDD | SIO0 | SIO1 | GND |
| 2 | | | | | | | | | | | | | | | | |
| 1 | VDD | GND | | GND | VDD | GND | GND | | | | | GND | GND | | GND | VDD |

150

# FLASH MEMORY WITH RDRAM INTERFACE

FIELD OF THE INVENTION

The present invention relates generally to memory devices and in particular the present invention relates to a non-volatile flash memory interface.

BACKGROUND OF THE INVENTION

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Asynchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

Advances in DRAM interfaces has resulted in double data rate (DDR) DRAMs. These memory devices provide data communication that is synchronized to both rising and falling edges of a clock signal. While DDR DRAMs provide for fast data communications, the data is stored in a volatile manner. Likewise, Rambus memory devices, such as RDRAM, provide a packet based alternative high-speed memory choice. The RDRAM provides similar operations as the DDR DRAM, and is volatile in nature.

For the reasons stated above, and for other reasons stated below which will become apparent to those skilled in the art upon reading and understanding the present specification, there is a need in the art for a non-volatile memory that can communicate at fast DRAM speeds.

SUMMARY OF THE INVENTION

The above-mentioned problems with non-volatile memories and other problems are addressed by the present invention and will be understood by reading and studying the following specification.

In one embodiment, a flash memory comprises an array of non-volatile memory cells, data connections, an interconnect configuration compatible with a rambus dynamic random access memory (RDRAM), and output circuitry to provide output data on the data connections on rising and falling edges of a clock signal.

In another embodiment, a flash memory comprises an array of non-volatile memory cells, data connections, a clock signal connection to receive a clock signal, and an interconnect configuration compatible with a rambus dynamic random access memory (RDRAM). Output circuitry provides output data on the data connections on rising and falling edges of the clock signal, and input circuitry receives input data on the data connections on rising and falling edges of the clock signal.

A method of reading a flash memory comprises providing a read command, providing memory cell addresses, reading first and second data words from non-volatile memory cells, outputting the first data word on a rising edge of a clock signal following a rambus dynamic random access memory (RDRAM) compatible format, and outputting the second data word on the falling edge of the clock signal following the rambus dynamic random access memory (RDRAM) compatible format.

In yet another embodiment, a flash memory comprises an array of nonvolatile memory cells having bit lines couplable to the non-volatile memory cells, sense amplifier circuitry coupled to the bit lines to detect a differential voltage between the bit lines, and pre-charge circuitry coupled to pre-charge the bit lines to first and second voltage levels to provide an initial differential voltage prior to sensing a memory cell. The memory includes data connections, a clock signal connection to receive a clock signal, and has an interconnect configuration compatible with a rambus dynamic random access memory (RDRAM). Output circuitry provides output data on the data connection on rising and falling edges of the clock signal.

BRIEF DESCRIPTION OF THE DRAWINGS

FIG. 2 illustrates an interconnect pin assignment of one embodiment of the present invention.

DETAILED DESCRIPTION OF THE DRAWINGS

Figure 1:
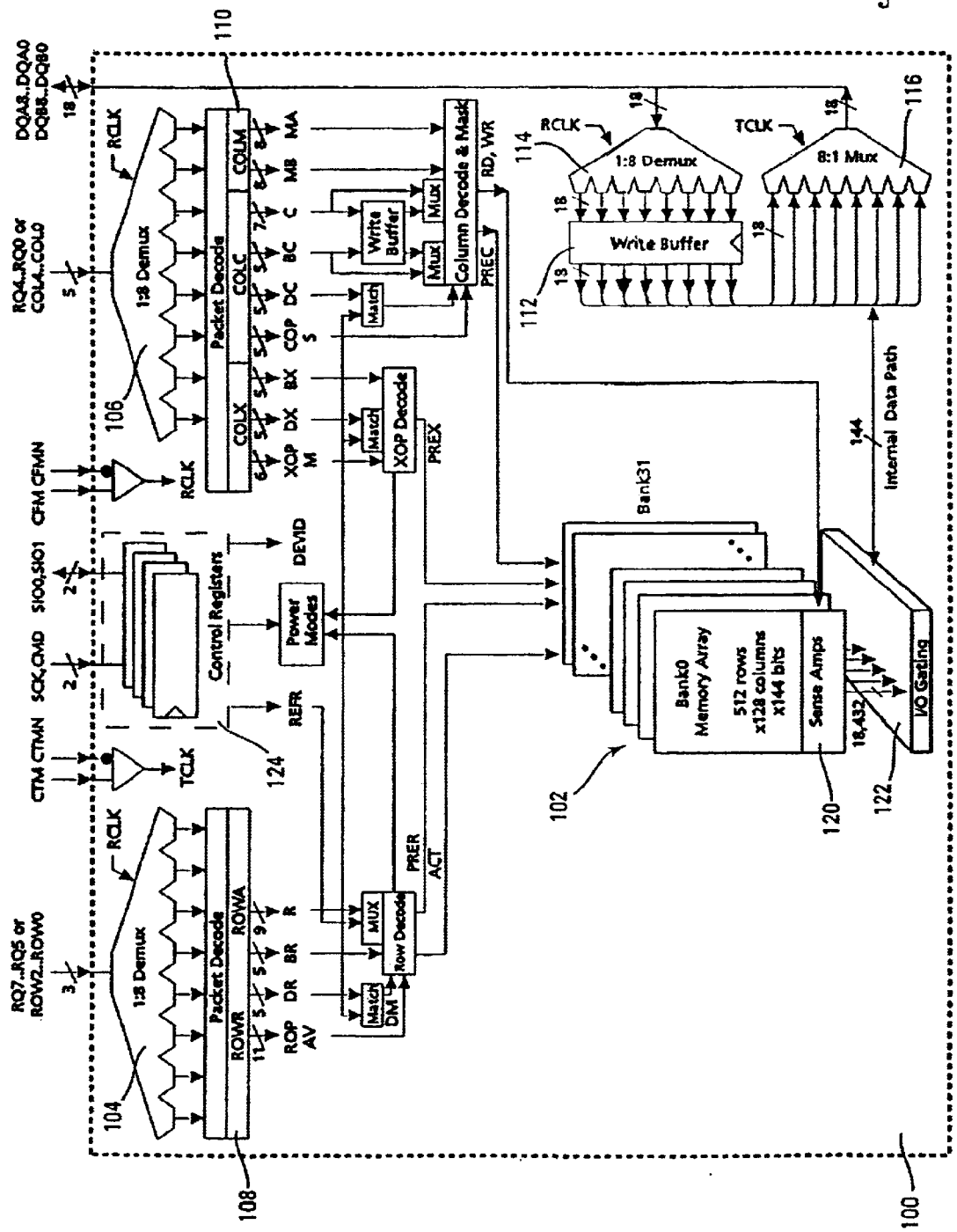
FIG. 1 is a block diagram of a non-volatile memory of one embodiment of the present invention.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a non-volatile memory device that is compatible with rambus dynamic random access memory (RDRAM). RDRAMs generally provide output data that is synchronized to both transitions of a clock signal.

Referring to FIG. 1, a block diagram of a flash memory according to one embodiment of the present invention is described. The memory device includes an array of non-volatile floating gate memory cells. As known to those in the art, the non-volatile memory cells store a charge on the floating gate. The floating gate charge changes the threshold voltage of the memory cell. In traditional flash memory cells, a current-sensing scheme was employed to read the memory cells. The present invention uses a voltage-sensing scheme to read the non-volatile memory cells Possible voltage-sensing schemes are described in U.S. patent applications "Differential Sensing in a Memory Using Two Cycle Pre-Charge" Ser. No. 09/648,706, filed Aug. 25, 2000; "Bit Line Pre-Charge in a Memory" Ser. No. 09/648,701, filed Aug. 25, 2000; "Adjustable Pre-Charge in a Memory" Ser. No. 09/648,722, filed Aug. 25, 2000; and "Differential Sensing in a Memory" Ser. No. 09/648,723, filed Aug. 25, 2000, each incorporated herein by reference.

The flash memory of the present invention can be arranged in numerous different architectures, and FIG. 1 is merely a representative architecture of the present invention. Memory device 100 includes an array of non-volatile flash memory cells 102 arranged in a plurality of addressable banks. Each memory bank can contain addressable sectors of memory cells. The data stored in the memory can be accessed using externally provided location address packets received by de-multiplex circuits 104 and 106. The address packets are decoded using column and row decode circuitry 108 and 110.

Write buffer 112 and de-multiplex circuit 114 are provided to write data received on DQ lines. Similarly, multiplex circuit 116 provides read data on the DQ lines. Sense amplifier circuitry 120 is used to read the data from the flash cells, and I/O gating 122 is used to communicate with the array. Sense amplifier circuitry 120 includes bit line pre-charge circuitry used to read the non-volatile memory cells. Command logic 124 is provided to control the basic operations of the memory device. The command logic also includes control registers used to store data for memory operation control. Other embodiments can include separate the read and write paths to provide for the power requirements of writing to the flash cells.

FIG. 2 illustrates an interconnect pin assignment of one embodiment of the present invention. The memory package 150 has an interconnect configuration that is substantially similar to available RDRAM packages. Although the present invention shares interconnect labels that are appear the same as RDRAM's, the function of the signals provided on the interconnects are described herein and should not be equated to RDRAM's unless set forth herein.

The flash memory provides an RDRAM interface that provides two data words per clock cycle. Read accesses to the memory can be burst oriented. That is, memory accesses start at a selected location and continue for a programmed number of locations in a programmed sequence.

The present invention uses a data-sensing scheme that increases the speed of read operations and reduces current consumption compared to conventional flash memory devices. That is, conventional flash memories use a current sensing technique that compares a current conducted by a memory cell to a reference current. This sensing technique is slower than a DRAM differential voltage-sensing scheme. Further, to read numerous columns of memory cells simultaneously, conventional current sensing techniques consume a relatively large current.

An embodiment of the present invention uses a voltage sensing technique to read the non-volatile memory cells. In one embodiment, differential digit lines are pre-charged to different voltage levels prior to accessing a memory cell. For example, an active digit line that is coupled to a read memory cell can be pre-charged to a voltage that is greater than a complementary digit line. If the read memory cell is un-programmed (conducts current when read), the active digit line is quickly discharged below the complementary digit line voltage. If the read memory cell is programmed (does not conduct current when read), the active digit line voltage remains above the complementary digit line voltage. A differential voltage sensing circuit can be used to detect and amplify the digit line voltages. Further, pre-charging the digit lines to a differential level is not limited to a specific technique, but can be accomplished using charge sharing, a bias circuit or the like.

The present invention allows both volatile and non-volatile memory devices to use a unified communication bus. As such, a separate non-volatile bus is eliminated. Both non-volatile and volatile memories use the volatile memory bus. Further, both memories respond to common command signals, although the command signals may be interpreted differently by the memories.

CONCLUSION

A flash memory has been described that has an interface corresponding to a rambus dynamic random access memory (RDRAM). The memory samples commands and addresses on a rising edge of a clock signal. The read and write data are provided on both the rising edge and the falling edge of the clock signal.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory comprising:
   an array of non-volatile memory cells;
   a clock signal connection to receive a clock signal;
   a rambus dynamic random access memory (RDRAM) interconnect configuration coupled to the array of non-volatile memory cells, the interconnect configuration comprising a multiplexed row address bus, a multiplexed column address bus, and data connections that are burst oriented;
   output circuitry to provide output data on the data connections on rising and falling edges of the clock signal, the output circuitry is further adapted to provide the locations in a programmed sequence; and
   input circuitry to receive input data on the data connections on rising and falling edges of the clock signal.

2. The flash memory of claim 1, wherein the array of non-volatile memory cells are arranged in a plurality of addressable banks.

3. The flash memory of claim 2, wherein each addressable bank contains addressable sectors of memory cells.

4. A flash memory comprising:
   an array of non-volatile memory cells arranged in a plurality of addressable banks;
   a clock signal connection to receive a clock signal;
   a rambus dynamic random access memory (RDRAM) interconnect configuration coupled to the array of non-volatile memory cells, the interconnect configuration comprising a multiplexed row address bus, a multiplexed column address bus, and data connections that are burst oriented;
   output circuitry to provide output data on the data connections on rising and falling edges of the clock signal, the output circuitry is further adapted to provide the output data starting at a selected location and continuing for a programmed number of locations in a programmed sequence;
   input circuitry to receive input data on the data connections at a rate of two data words per clock cycle; and
   sense amplifier circuitry coupled to the array, wherein the sense amplifier circuitry detects a differential voltage.

5. The flash memory of claim 4, wherein the memory is adapted to provide burst-oriented read accesses.

* * * * *

UNITED STATES PATENT AND TRADEMARK OFFICE
CERTIFICATE OF CORRECTION

PATENT NO. : 6,741,497 B2
DATED : May 25, 2004
INVENTOR(S) : Roohparvar et al.

It is certified that error appears in the above-identified patent and that said Letters Patent is hereby corrected as shown below:

<u>Column 4,</u>
Line 34, insert -- output data starting at a selected location and continuing for a programmed number of --

Signed and Sealed this

Thirtieth Day of November, 2004

JON W. DUDAS
*Director of the United States Patent and Trademark Office*